(12) United States Patent (10) Patent No.: US 8,415,567 B1
Sawyer et al. (45) Date of Patent: Apr. 9, 2013

(54) FORMING SOLDERING SURFACES WITHOUT REQUIRING A SOLDER MASK

(75) Inventors: Brian D. Sawyer, Palo Alto, CA (US); Thomas Scott Morris, Lewisville, NC (US); Milind Shah, San Diego, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 423 days.

(21) Appl. No.: 12/700,512

(22) Filed: Feb. 4, 2010

Related U.S. Application Data

(60) Provisional application No. 61/149,774, filed on Feb. 4, 2009.

(51) Int. Cl.
*H05K 1/16* (2006.01)
*H05K 3/34* (2006.01)

(52) U.S. Cl. .......................................... 174/260; 29/840

(58) Field of Classification Search .................. 174/260; 29/840, 847, 849; 361/767–771, 774, 783
See application file for complete search history.

(56) References Cited

U.S. PATENT DOCUMENTS

2004/0216917 A1* 11/2004 Amir et al. .................... 174/257

* cited by examiner

*Primary Examiner* — Jeremy Norris
(74) *Attorney, Agent, or Firm* — Withrow & Terranova, P.L.L.C.

(57) ABSTRACT

The present invention relates to a multi-layer laminate or substrate manufacturing process for forming soldering surfaces on a substrate of a module without requiring a solder mask. In one embodiment, a substrate is provided having a substrate body, soldering pads, and a metal segment. A patterned mask is formed over the substrate such that soldering surfaces of the soldering pads remain exposed. The soldering surfaces of the soldering pads are plated to create plated soldering surfaces over the soldering pads. The plated soldering surfaces are the regions for solder placement. The patterned mask is then removed from the substrate. Next, an anti-wetting treatment is applied to the substrate such that any unplated metal surfaces react to the anti-wetting treatment to form treated surfaces. As such, the plated soldering surfaces will wet solder while the treated surface will not wet solder. In a preferred embodiment, the anti-wetting treatment is an oxidation process.

20 Claims, 4 Drawing Sheets

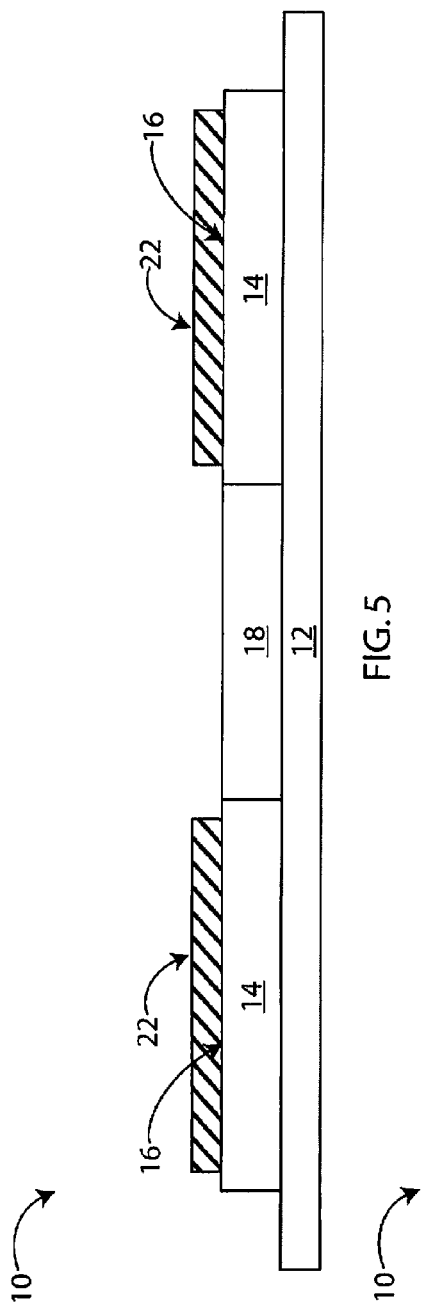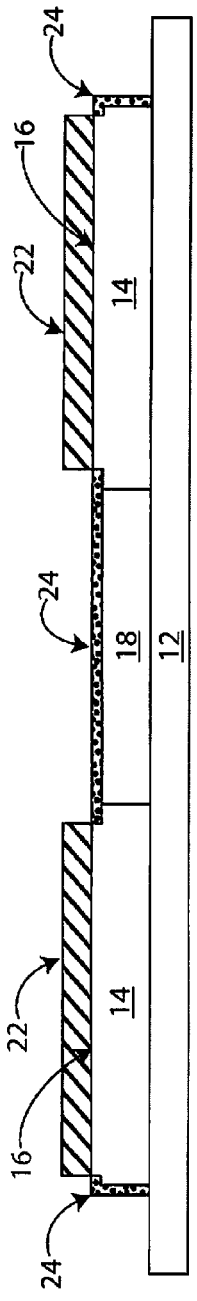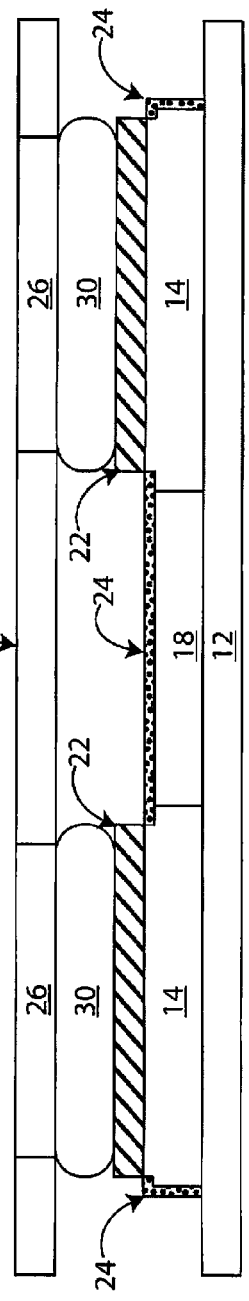

FORMING SOLDERING SURFACES WITHOUT REQUIRING A SOLDER MASK

This application claims the benefit of U.S. Provisional Patent Application Ser. No. 61/149,774, filed Feb. 4, 2009, the disclosure of which is hereby incorporated herein by reference in its entirety.

FIELD OF THE INVENTION

The present invention pertains to semiconductor processes, and more particularly to the multi-layer laminate or substrate manufacturing process that forms soldering surfaces without requiring a solder mask.

BACKGROUND OF THE INVENTION

Many modern electronics require the use of solder to electrically and physically connect various components to a substrate. The components are connected to soldering pads, which reside in or on the surface of the substrate and form part of the substrate. The soldering pads provide electrical connections to various traces or metal layers, which reside in or on the substrate and provide connections to other components.

A solder mask is a patterned material that is formed over the substrate and only exposes those areas, such as the soldering pads, of the substrate where solder is desired. The solder masks cover those areas of the substrate where solder is not desired. The solder mask controls placement of the solder. Notably, the solder mask also forms barriers about each soldering pad and prevents solder from flowing between adjacent soldering pads to avoid electrical shorting of the adjacent soldering pads. The solder mask is typically applied as one of the final layers when forming a substrate and is applied using a separate process. A typical solder mask, which may be an epoxy liquid, photoimageable liquid, or photoimageable dry film, is formed from applying a layer of polymer that provides a permanent protective coating for metal traces and prevents solder from bridging between conductors.

In addition to being relatively expensive and cumbersome, current processes for applying a solder mask have limitations, which impose restrictions on how small a soldering pad can be as well as how close soldering pads can be to one another. This has proven problematic as there are constant pressures in the electronics industry to reduce the scale of electronics, and thus the overall footprints of most semiconductor circuits and the substrates on which these circuits are formed. Reducing the overall footprints of semiconductor circuits generally requires corresponding reductions in the size of soldering pads and the spacing therebetween. Accordingly, there is a need for a new solder masking technique that does not require a separate solder mask and does not employ traditional solder masking techniques and materials.

SUMMARY OF THE INVENTION

The present invention relates to a multi-layer laminate or substrate manufacturing process for forming soldering surfaces on a substrate of a module without requiring a solder mask. In one embodiment, a substrate is provided having a substrate body, soldering pads, and a metal segment. A patterned mask is formed over the substrate such that soldering surfaces of the soldering pads remain exposed. The soldering surfaces of the soldering pads are plated to create plated soldering surfaces over the soldering pads. The plated soldering surfaces are the regions for solder placement. As such, the plating forming the plated soldering surfaces is selected to be a solderable material. The patterned mask is then removed from the substrate. Next, an anti-wetting treatment is applied to the substrate such that any unplated metal surfaces react to the anti-wetting treatment to form treated surfaces. As such, the plated soldering surfaces will wet solder while the treated surfaces will not wet solder. The exposed surfaces of the metal segments as well as any exposed and unplated surfaces of the soldering pads may form treated surfaces. Notably, the plated soldering surfaces do not react to the anti-wetting treatment, or at least react in a different way than the unplated metal surfaces. In a preferred embodiment, the anti-wetting treatment is an oxidation process, wherein the exposed metal surfaces are oxidized to form the treated surface. The resulting structure is heated to remove residual moisture.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 1 provides a flow diagram that illustrates an exemplary multi-layer laminate or substrate process according to one embodiment of the present invention.

FIGS. 2-6 illustrate the steps associated with the multi-layer laminate or substrate process provided in FIG. 1.

FIG. 7 illustrates an exemplary application of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
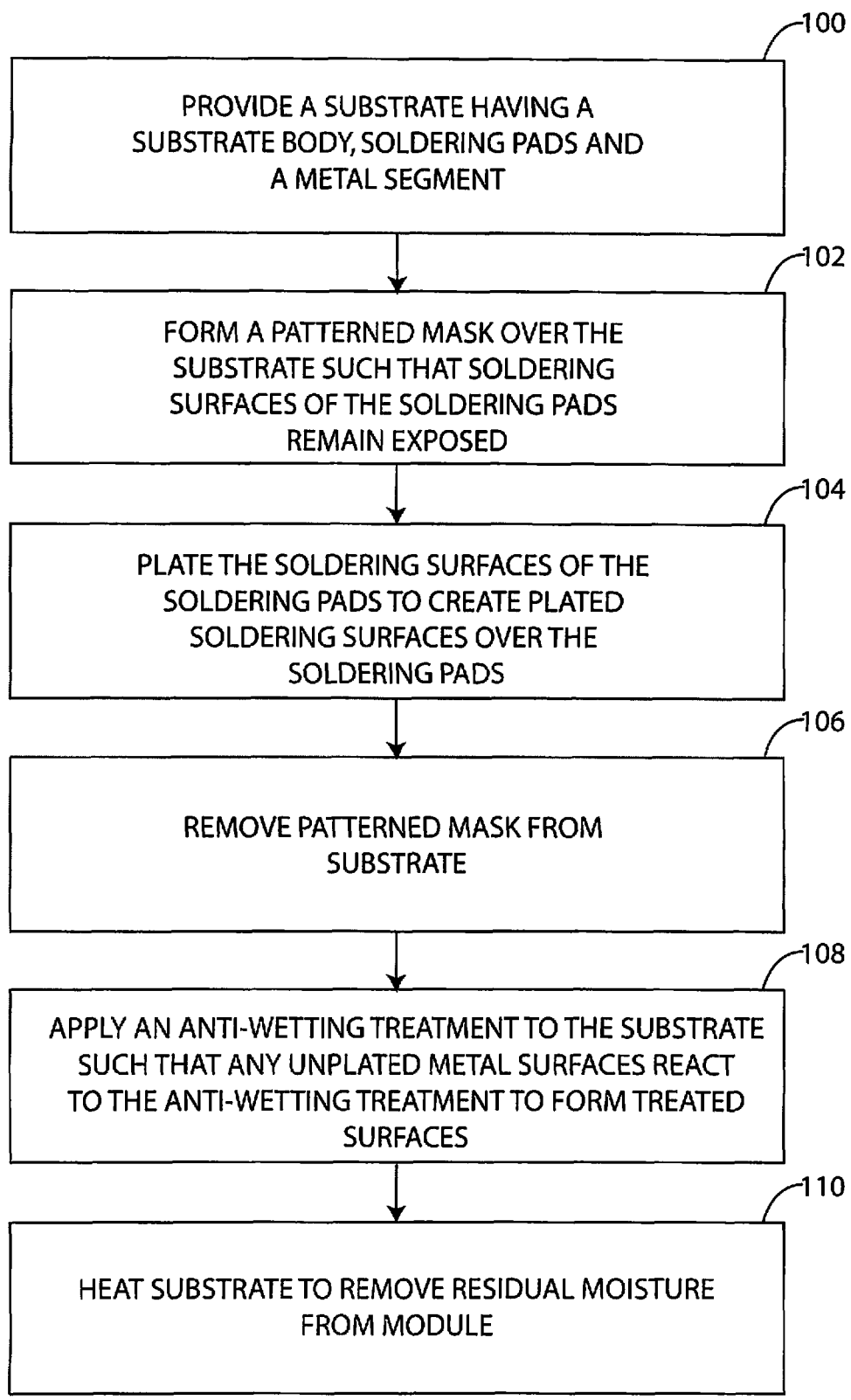
Figure 2:
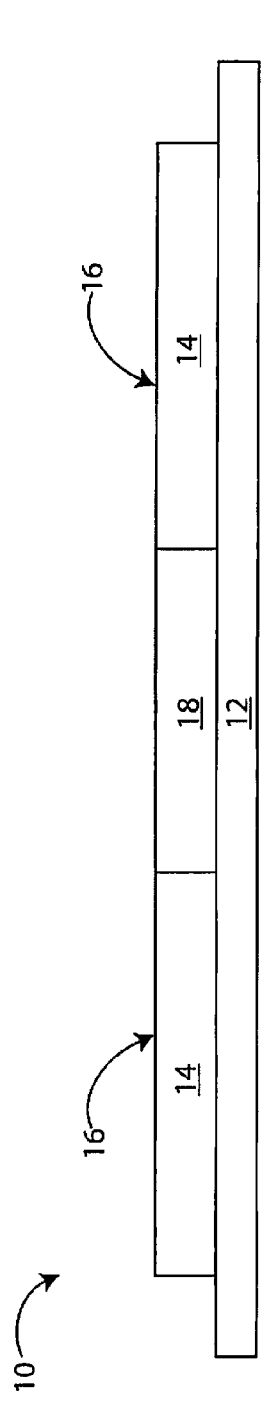

The present invention relates to a multi-layer laminate or substrate manufacturing process for forming soldering surfaces on a substrate of a module without requiring a solder mask. FIG. 1 provides a flow diagram that illustrates an exemplary multi-layer laminate or substrate process, according to one embodiment of the present invention. FIGS. 2-6 illustrate the steps associated with the multi-layer laminate or substrate process provided in FIG. 1. Initially, a substrate 10 is provided as depicted in FIG. 2 (Step 100). For the purpose of this illustration, the substrate 10 includes a substrate body 12 and two soldering pads 14, each having a soldering surface 16 to which components, modules, wire bonds, and the like will be electrically and physically connected using a soldering process. Although the soldering pads 14 are connected by a metal segment 18 formed on the surface of the substrate body 12, those skilled in the art will recognize other possible configurations. The goal of the illustration is to depict metal portions that will serve as soldering surfaces along with metal surfaces that are not to be soldered. The metal segment 18 represents a metal surface that is not to be soldered. Notably, the soldering pads 14 may represent wire bond pads, flip chip pads, surface mount devices (SMD), or the like. The metal segment 18 may represent a metal trace, signal plane, or the like. The soldering pads 14 and metal segment 18 may be formed from the same or different material such as copper or like conductor. Preferably, the soldering pads 14 and metal segment 18 are formed from a single metal layer residing on the surface of the substrate body 12.

Figure 3:
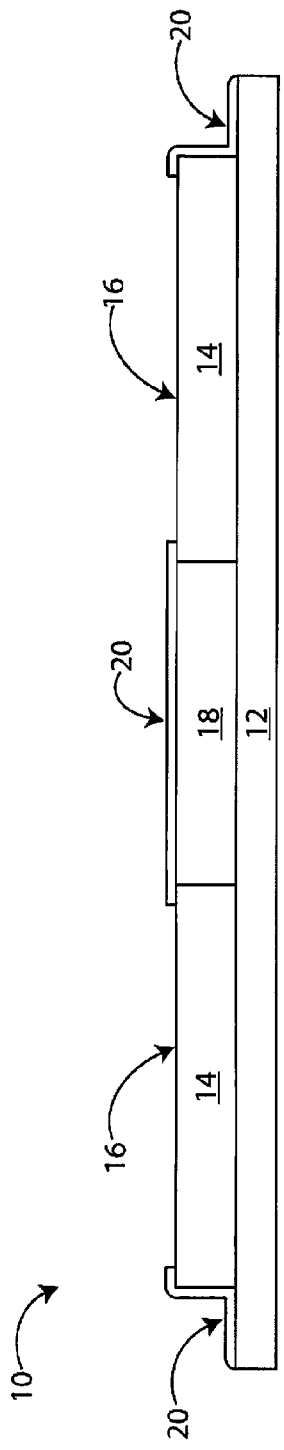
Figure 4:
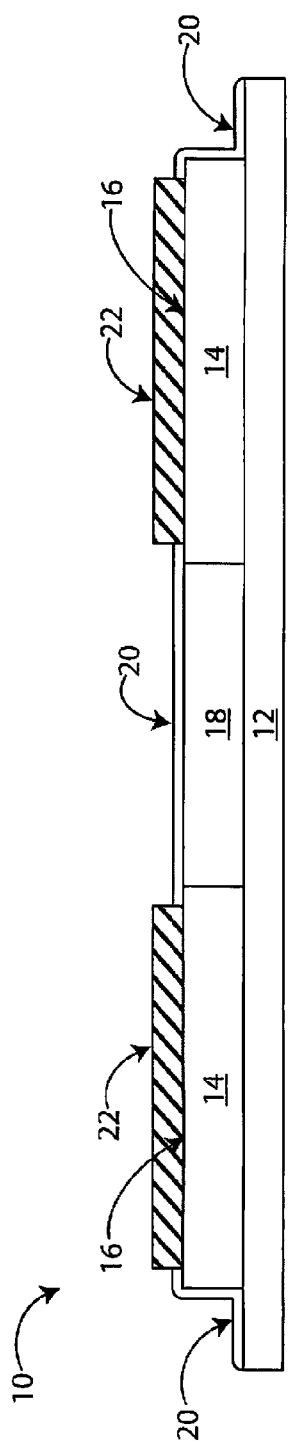

Initially, a patterned mask 20 is formed over the substrate 10 such that the soldering surfaces 16 of the soldering pads 14 remain exposed as illustrated in FIG. 3 (Step 102). The patterned mask 20 may be a photoresist, a conformal mask, or the like. A plating process is used to plate the soldering surfaces 16 of the soldering pads 14 and thus, create plated soldering surfaces 22 over the soldering pads 14 as illustrated in FIG. 4 (Step 104). The plated soldering surfaces 22 may be electroless nickel (Ni), electroless palladium (Pd) and immersion gold (Au) (ENEPIG), electroless nickel (Ni) and immersion gold (Au) (ENIG), electrolytic silver (EAg), direct immersion silver (DIAg), direct immersion gold (Au) (DIG), electrolytic nickel (Ni) and autocatalytic gold (Au) (ENAG), solder, or any like plated soldering surface 22. The plated soldering surface 22 may be between about 1 μm to 10 μm in thickness. In a preferred embodiment, the plated soldering surface 22 is between about 5 μm to 8 μm in thickness. The plated soldering surfaces 22 are the regions to be soldered. Preferably, the plated soldering surfaces 22 provide solderable surfaces that are not adversely responsive to a subsequent anti-wetting treatment.

The patterned mask 20 is removed from the substrate 10 as illustrated in FIG. 5 (Step 106). An anti-wetting treatment is applied over the substrate 10 such that exposed surfaces of the metal segment 18 as well as any exposed and unplated surfaces of the soldering pads 14 form treated surfaces 24 as illustrated in FIG. 6 (Step 108). The anti-wetting treatment may be a cupric (black) oxide (CuO) oxidation treatment, cuprous (brown) oxide ($Cu_2O$) oxidation treatment, or any similar treatment that prevents the wetting of solder to any treated surfaces of the metal segment 18 as well as any exposed and unplated surfaces of the soldering pads 14. As such, the plated soldering surfaces 22 will wet solder while the treated surfaces 24 will not wet solder. Notably, the plated soldering surfaces 22 do not react to the anti-wetting treatment, or at least react in a different way than the unplated metal surfaces. When black oxidation, brown oxidation, or like oxidation treatments are used, the treated surfaces 24 are a resulting oxide layer that is formed over the exposed and unplated surfaces of the substrate 10. After cleaning and rinsing, a black oxide coating is formed by a chemical reaction between the substrate 10 and an alkaline aqueous salt solution at low temperatures. The subsequently developed oxide layer is made up of cupric oxide (CuO). For a brown oxide coating, a post black oxide reduction process is done. This reduction process chemically forms a cuprous oxide ($Cu_2O$) from the cupric oxide (CuO) layer, as is known by one skilled in the art.

All of these oxides are on the outer surface of the laminate (denoted as treated surface 24). The resultant oxide is rough in appearance compared to untreated copper (Cu). Both black (cupric) and brown (cuprous) oxide are non solderable surfaces. The mechanism behind soldering is the solubility of one metal into another. To form this inter-metallic bond, all the surfaces should be free from any contaminants. So in the case of Tin (Sn) based solders, the oxide will inhibit the formation of CuSn intermetallics.

With the present invention, a solder mask is not needed because the treated surfaces 24 provide a virtual solder mask. By eliminating the need for a separate solder mask, soldering pads 14 may be smaller and require less spacing than that which is typically allowed when a separate solder mask is used. Finally, the substrate 10 is heated to remove residual moisture from the substrate 10, preparing the substrate 10 for subsequent processing steps (Step 110).

In FIG. 7, an exemplary application of the present invention is depicted. In this illustration, soldering pads 26 of a component 28 are mounted to the substrate 10 by heating and cooling the solder bumps 30. When the solder bumps 30 are heated above their melting point, the solder bumps 30 will melt and flow over the plated soldering surface 22. However, the molten solder will not flow over the treated surfaces 24. The component 28 may be an SMD, flip chip, or like component. As such, the solder bumps 30 directly connect the plated soldering surface 22 of the substrate 10 to the soldering pads 26 of the component 28.

Figure 8:
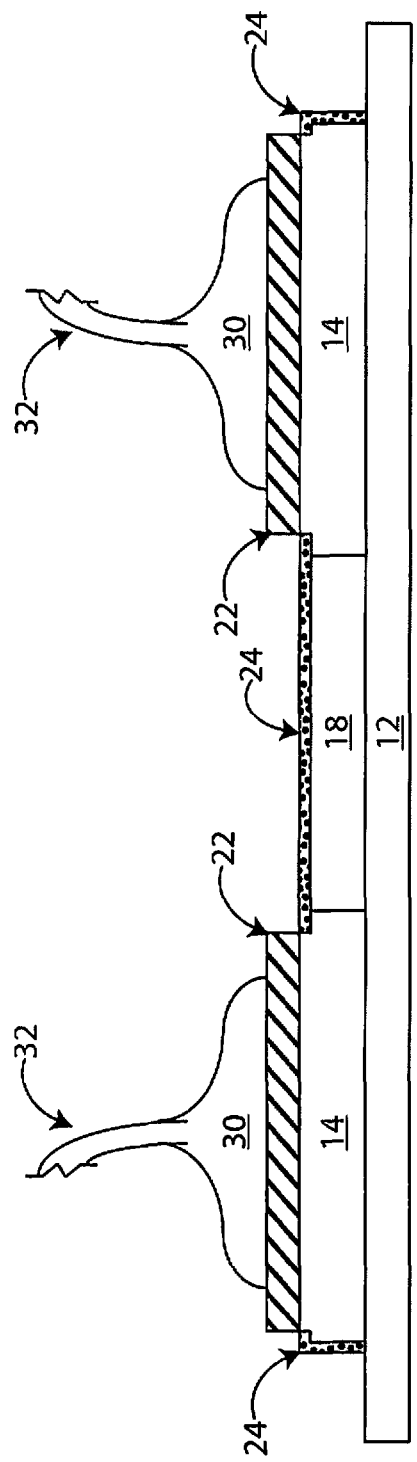
FIG. 8 illustrates an alternative exemplary application of the present invention.

In FIG. 8, an alternative exemplary application of the present invention is depicted. In this illustration, wire bonds 32 are electrically and physically connected to the substrate 10 by solder bumps 30. The solder bumps 30 directly connect the plated soldering surface 22 of the substrate 10 to the wire bonds 32.

Those skilled in the art will recognize improvements and modifications to the preferred embodiments of the present invention. All such improvements and modifications are considered within the scope of the concepts disclosed herein and the claims that follow.

What is claimed is:

1. A method comprising:
   providing a substrate having a substrate body, soldering pads, and a metal segment;
   forming a patterned mask over the substrate such that soldering surfaces of the soldering pads remain exposed;
   plating the soldering surfaces of the soldering pads to create plated soldering surfaces over the soldering pads;
   removing the patterned mask from the substrate;
   providing an anti-wetting treatment to the substrate such that exposed surfaces of the metal segments as well as any exposed and unplated surfaces react with the anti-wetting treatment to form treated surfaces that will not wet solder, and the plated soldering surfaces react with the anti-wetting treatment in such a way as to remain able to wet solder.

2. The method of claim 1 wherein the soldering pads and metal segment are formed from the same material.

3. The method of claim 2 wherein the soldering pads and metal segment are formed from a single metal layer on the substrate.

4. The method of claim 1 wherein the plated soldering surfaces may be one of a group consisting of electroless nickel (Ni), electroless palladium (Pd) and immersion gold (Au) (ENEPIG), electroless nickel (Ni) and immersion gold (Au) (ENIG), direct immersion gold (Au) (DIG), electrolytic silver (EAg), direct immersion silver (DIAg), electrolytic nickel (Ni) and autocatalytic gold (Au) (ENAG), and solder.

5. The method of claim 1 wherein a thickness of the plated soldering surfaces is between about 1 μm to 10 μm.

6. The method of claim 1 wherein the anti-wetting treatment is an oxidation process that oxidizes the exposed surfaces of the metal segments as well as the any exposed and unplated surfaces of the soldering pads to form the treated surfaces.

7. The method of claim 6 wherein the oxidation process is one of a group consisting of a cupric oxide (CuO) process and a cuprous oxide ($Cu_2O$) process and the treated surface comprises one of a group consisting of cupric oxide (CuO) and cuprous oxide ($Cu_2O$).

8. The method of claim 1 wherein the substrate is connected to another component by solder bumps created over the plated soldering surfaces.

9. The method of claim 8 wherein the another component may be one of the group consisting of a flip chip component, a surface mount device, and a wire bond.

10. The method of claim 1 wherein the soldering surfaces are formed without a separate solder mask.

11. A substrate formed by a process comprising:
providing a substrate having a substrate body, soldering pads, and a metal segment;
forming a patterned mask over the substrate such that soldering surfaces of the soldering pads remain exposed;
plating the soldering surfaces of the soldering pads to create plated soldering surfaces over the soldering pads;
removing the patterned mask from the substrate; and
providing an anti-wetting treatment to the substrate such that exposed surfaces of the metal segments as well as any exposed and unplated surfaces react with the anti-wetting treatment to form treated surfaces that will not wet solder, and the plated soldering surfaces react with the anti-wetting treatment in such a way as to remain able to wet solder, wherein solder will wet to the plated soldering surfaces, but not to the treated surfaces.

12. The substrate of claim 11 wherein the soldering pads and metal segment are formed from the same material.

13. The substrate of claim 12 wherein the soldering pads and metal segment are formed from a single metal layer on the substrate.

14. The substrate of claim 11 wherein the plated soldering surfaces may be one of a group consisting of electroless nickel (Ni), electroless palladium (Pd) and immersion gold (Au) (ENEPIG), electroless nickel (Ni) and immersion gold (Au) (ENIG), direct immersion gold (Au) (DIG), electrolytic silver (EAg), direct immersion silver (DIAg), electrolytic nickel (Ni) and autocatalytic gold (Au) (ENAG), and solder.

15. The substrate of claim 11 wherein a thickness of the plated soldering surfaces is between about 1 μm to 10 μm.

16. The substrate of claim 11 wherein the anti-wetting treatment is an oxidation process that oxidizes the exposed surfaces of the metal segments as well as the any exposed and unplated surfaces of the soldering pads to form the treated surfaces.

17. The substrate of claim 16 wherein the oxidation process is one of a group consisting of a cupric oxide (CuO) process and a cuprous oxide ($Cu_2O$) process and the treated surface comprises one of a group consisting of cupric oxide (CuO) and cuprous oxide ($Cu_2O$).

18. The substrate of claim 11 wherein the substrate is connected to another component by solder bumps created over the plated soldering surfaces.

19. The substrate of claim 18 wherein the another component may be one of a group consisting of a flip chip component, a surface mount device, and a wire bond.

20. The substrate of claim 11 wherein the soldering surfaces are formed without a separate solder mask.

* * * * *